United States Patent
Tailliet et al.

(10) Patent No.: US 10,679,699 B2
(45) Date of Patent: Jun. 9, 2020

(54) NON-VOLATILE MEMORY WITH DOUBLE CAPA IMPLANT

(71) Applicant: STMicroelectronics (Rousset) SAS, Rousset (FR)

(72) Inventors: Francois Tailliet, Fuveau (FR); Roberto Simola, Trets (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/048,524

(22) Filed: Jul. 30, 2018

(65) Prior Publication Data

US 2020/0035304 A1    Jan. 30, 2020

(51) Int. Cl.
  *G11C 16/04* (2006.01)
  *H01L 27/11517* (2017.01)
  *H01L 29/423* (2006.01)

(52) U.S. Cl.
  CPC ...... *G11C 16/0483* (2013.01); *G11C 16/0408* (2013.01); *H01L 27/11517* (2013.01); *H01L 29/42328* (2013.01)

(58) Field of Classification Search
  CPC ............ G11C 16/0408; G11C 16/0483; H01L 27/11517; H01L 29/42328
  USPC .......................................................... 257/316
  See application file for complete search history.

(56) References Cited

U.S. PATENT DOCUMENTS

| | | | | |
|---|---|---|---|---|
| 5,792,670 A | * | 8/1998 | Pio | H01L 27/115 257/E21.69 |
| 5,793,673 A | * | 8/1998 | Pio | H01L 27/115 257/316 |
| 2016/0155506 A1 | | 6/2016 | Tailliet | |
| 2018/0033487 A1 | | 2/2018 | Tailliet | |

* cited by examiner

*Primary Examiner* — Long K Tran
(74) *Attorney, Agent, or Firm* — Crowe & Dunlevy

(57) ABSTRACT

An EEPROM includes a floating gate transistor having a source region, a channel region and a drain region. A first capa implant zone on a drain-side of the floating gate transistor has a first dopant concentration level. A second capa implant zone in the first capa implant zone adjacent the drain region has a second dopant concentration level that is greater than the first dopant concentration level. A gate oxide region insulates the floating gate electrode from the channel region, first capa implant zone and second capa implant zone. A thickness of the gate oxide region is thinner at the second capa implant zone than at the channel region and first capa implant zone.

23 Claims, 5 Drawing Sheets

NON-VOLATILE MEMORY WITH DOUBLE CAPA IMPLANT

TECHNICAL FIELD

The present invention relates to memories and, in particular, to electrically erasable and programmable non-volatile read only memories (EEPROM).

BACKGROUND

In an EEPROM memory, the logic value of a logic datum, or bit, stored in a memory cell is represented by an off or on state of the memory cell and more precisely by the value of the threshold voltage of a floating gate transistor (also referred to as the state transistor). The on or off states of the memory cell may be modified at will in a write cycle generally comprising an erasing operation followed by a programming operation, where both of these operations are implemented using relatively high voltages.

FIG. 1 is a cross-sectional view of a conventional EEPROM memory cell 10 implemented as an integrated circuit and FIG. 2 shows a schematic circuit diagram of the conventional EEPROM memory cell 10. See, for example, FIGS. 1-2 of United States Patent Application Publication No. 2018/0033487 (incorporated by reference). A semiconductor substrate layer (bulk or semiconductor on insulator—SOI) 12 that is lightly doped with a first conductivity type dopant (for example, p-type) includes an active area 14 where the memory cell 10 is located. The active area 14 may, for example, be delimited by structure as needed for the memory application. The memory cell 10 includes an n-channel floating gate transistor 20 and an access transistor 22 (also referred to as the selection transistor). The source-drain paths of the floating gate transistor 20 and access transistor 22 are coupled in series between a source line (SL) 24 (connected to the source of transistor 20) and a bit line (BL) 26 (connected to the drain of transistor 22).

The floating gate transistor 20 includes a source region 32 in the active area 14 of the semiconductor substrate layer 12 that is heavily doped with a second conductivity type dopant (for example, n-type), a drain region 34 in the active area 14 of the semiconductor substrate layer 12 that is also heavily doped with the second conductivity type dopant, and an implant zone 48 (that is an extension of the drain region 34) in the active area 14 of the semiconductor substrate layer 12 that is also heavily doped with the second conductivity type dopant. A channel region 36 for the floating gate transistor 20 is located between the source region 32 and the implant zone 48. A gate structure for the floating gate transistor 20 is located over the channel region 36 and includes a floating gate electrode 42 and a control gate (CG0) electrode 44. The floating gate electrode 42 is separated from the channel region 36 and the implant zone 48 by a gate oxide layer 46 which includes a relatively thicker layer portion 46a, also referred to as the high voltage gate oxide, formed on the source side of the floating gate transistor 20, and a relatively thinner layer portion 46b, also referred to as the tunnel gate oxide, formed on the drain side of the floating gate transistor 20. The floating gate electrode 42 is insulated from the control gate (CG0) electrode 44 by an oxide-nitride-oxide (ONO) tri-layer. A tunnel injection zone 50 is located at the drain side of the floating gate transistor 20 corresponding to the location of the tunnel gate oxide layer portion 46b. The implant zone 48 underneath the tunnel gate oxide layer portion 46b is known in the art as a capacitor implant ("capa implant") zone because its presence below the gate creates a capacitor structure. The capa implant zone 48 behaves like the channel of an "on" NMOS transistor where the channel is in strong inversion. The channel provided by the capa implant zone 48 under the gate is always present, unlike a conventional enhanced NMOS transistor which requires the gate voltage to exceed the MOS threshold voltage in order to form the N channel below the gate. The capa implant zone 48 is positioned in contact with, and functions as an extension of, the drain region 34 and is laterally dimensioned to distance the tunnel injection zone 50 from the drain-channel junction of the floating gate transistor 20. In this regard, it will be noted that the relatively thicker layer portion 46a of the gate oxide 46 is present over the capa implant zone 48 between the tunnel injection zone 50 and the edge of the capa implant zone 48 at the drain-channel junction. Relatively speaking, the dopant concentration level in the implant zone 48 can be greater than or less than the dopant concentration level in the drain region 34 (for example, having a dopant concentration in the range of $1 \times 10^{17}$ to $1 \times 10^{19}$ at/cm$^3$), and the implant zone 48 may extend deeper (as shown) or shallower into the semiconductor substrate layer 12 than the depth of the drain region 34.

The access transistor 22 uses the drain region 34 as its source region, and further includes a drain region 38 in the semiconductor substrate layer 12 that is also heavily doped with the second conductivity type dopant. A channel region 40 for the access transistor 22 is located in the semiconductor substrate layer 12 between the regions 34 and 38. A gate structure for the access transistor 22 is located over the channel region 40 and includes a gate electrode 62 that is short-circuited to a word line (WL) 64 by connections (not shown in the figure) present along the length of the word line 64. The gate electrode 62 is insulated from the channel region 40 by a gate oxide layer 66. The gate oxide layer 66 may, for example, have a thickness which is equal to, or greater than, the thickness of the relatively thicker layer portion 46a.

There are well known trade-offs between design selection of the tunnel gate oxide layer portion 46b thickness, the memory cell erase and program voltages and the memory cell erase and program threshold shifts.

Turning first to tunnel oxide thickness: at a given voltage across the tunnel layer a thinner thickness of the tunnel gate oxide layer portion 46b will provide for a higher electric field, and accordingly a higher Fowler-Nordheim current. As a result, the memory cell erase and program threshold shifts will be higher. However, satisfactory data retention in the memory cell requires the thickness of the tunnel gate oxide layer portion 46b to exceed some determinable minimum value. A thinner tunnel gate oxide layer portion 46b increases the likelihood of high trap-assisted tunneling and reduces reliability of data retention. In balancing these factors, memory cell designers have found that a thickness of 7-8 nm, for example, for the tunnel gate oxide layer portion 46b is satisfactory.

Turning next to memory cell erase and program voltages: higher voltages permit the use of a thicker tunnel gate oxide layer portion 46b and support better data retention. Additionally, higher voltages allow for lower coupling factors, more compact memory cells and improved cell endurance. However, the higher voltages are also seen by other transistors involved in accessing the memory cell (such as the access transistor 22, the control gate switching transistors, and bit line and word line decoding transistors). As memory cell area shrinks, it becomes difficult to make these other transistors compact while still being able to withstand the high voltage levels. So, acceptable voltage levels for memory cell erase and program should typically not exceed 13-15V.

With respect to the memory cell erase and program threshold shifts, this refers to the threshold differences of erased and programmed memory cells in comparison to the threshold of a so-called "virgin" cell which has no charge stored on the floating gate. These threshold shifts are converted by sense amplifiers to logic levels. A plurality of sense amplifiers are provided for a memory array, with these sense amplifiers operating to read a corresponding plurality of memory cells in parallel. A fast access time requires a significant threshold shift away from the virgin threshold so that the sense amplifiers can switch quickly. In an ideal case, the logical switching of the sense amplifier is centered at the virgin threshold. It is recognized, however, that it is quite difficult to ensure that two different sense amplifiers behave in the same way; for example, by having the same offset. The switching points of the plural sense amplifiers will not be the same, and will not be exactly centered in a way to ensure an optimal erasing condition. There is also a spread of the virgin thresholds across plural memory cells of the array, as well as a spread in erase and program threshold shifts across plural memory cells of the array. All taken into account, a safe threshold shift for the erased or programmed state is considered to equal or exceed +/−1V.

The threshold shift for the memory cell increases with larger applied voltages, thinner tunnel oxide thickness and longer duration pulses for erase and program operations. The maximum write time of the memory cell is equal to the sum of the duration of the erase pulse and the program pulse. A typical write time is on the order of 5 ms. The write time is typically a fixed value.

The operation to erase the memory cell 10 is as follows: a first voltage (for example, +13V) is applied to the control gate CG0 and a second voltage (for example, 0V) is applied to both the source line SL and the bit line BL. The floating gate electrode is coupled to the control gate (with a factor of about 0.7) to receive a third voltage (for example, +9V). The tunnel gate oxide layer portion 46b according sees a voltage of about +9V and the floating gate discharges through the tunnel oxide. At the end of the erase cycle, a negative charge of about 1V is present on the floating gate electrode.

The operation to program the memory cell 10 is as follows: the second voltage (for example, 0V) is applied to the control gate CG0. The first voltage (for example, +13V) is applied to the bit line BL. The word line WL voltage is set to +16V so that the source goes to bit line voltage of +13V due to body effect. Floating gate coupling to the source of the select transistor (with a factor of about 0.3) results in a voltage of +3.9V at the floating gate electrode. The tunnel gate oxide layer portion 46b according sees a voltage of about +9.1V (13V−3.9V) and the floating gate charges through the tunnel oxide. At the end of the program cycle, a positive charge of about 1V is present on the floating gate electrode.

It will be noted from the foregoing operational description that the applied voltage for memory cell erase and program is not fully seen by the tunnel gate oxide layer portion 46b. This is due to continuity of electric field at the tunnel gate oxide layer portion 46b/floating gate electrode and tunnel gate oxide layer portion 46b/implant zone 48 (capa implant). During erase operations there is a depletion at the floating gate electrode with a corresponding voltage drop. During program operations there is a depletion at the implant zone 48 (capa implant) with a corresponding voltage drop.

These voltage losses reduce the voltage seen across the tunnel gate oxide layer portion 46b window. So, for a given erase or program voltage level, the final ΔVt (erase or program) across the tunnel gate oxide layer portion 46b window is reduced by this voltage loss. The voltage loss is typically higher during program phases because the depletion of the implant zone 48 (capa implant) is larger than the depletion of the floating gate electrode during erase phases. In any event, this voltage loss must be compensated for with a corresponding increase of the erase or program voltage level. This increase in voltage level of the memory cell erase and program can be undesirable for the reasons noted above.

To maintain an acceptable voltage level for memory cell erase and program operation, it is accordingly desirable to minimize the voltage loss. One way to accomplish this goal would be to increase the dopant concentration level of the implant zone 48 (capa implant). There are a number of drawbacks to this solution. First, the increased dopant concentration produces a reduction in the avalanche voltage at the edge between the channel 36 and capa implant 48 for the floating gate transistor 20. As a result, it will become impossible achieve a rise in voltage at the implant zone 48 (capa implant) to +13V, because avalanche breakdown will occur at the junction at a voltage level lower than +13V. Second, the increase in dopant concentration level in the implant zone 48 (capa implant) can lead to an increase in lateral diffusion and shortening of the effective length of the channel for the floating gate transistor 20. The reduction in effective length may induce a decrease in transistor threshold voltage with a corresponding increased risk of instability and leakage of the floating gate transistor 20.

There is accordingly a need in the art for a better solution to achieve a minimization of the voltage loss so as to increase the voltage at the implant zone 48 (capa implant) without needing to also increase the erase or program operation voltage level.

SUMMARY

In an embodiment, an electrically erasable and programmable nonvolatile memory includes a memory cell which includes a floating gate transistor. The floating gate transistor comprises: a source region disposed in a semiconductor layer; a drain region disposed in the semiconductor layer; a first capa implant zone disposed in the semiconductor layer adjacent the drain region; a channel region disposed in the semiconductor layer between the source region and the first capa implant zone; a second capa implant zone disposed in the first capa implant zone adjacent the drain region; wherein a dopant concentration level of the second capa implant zone is greater than a dopant concentration level of the first capa implant zone; a control gate electrode; a floating gate electrode, wherein the floating gate electrode is insulated from the control gate electrode; and a gate oxide region insulating the floating gate electrode from the channel region, the first capa implant zone and the second capa implant zone, wherein the gate oxide region has a first thickness over the channel region and a second thickness, less than the first thickness, over the second capa implant zone.

In an embodiment, a floating gate transistor comprises: a source region disposed in a semiconductor layer; a drain region disposed in the semiconductor layer; a first capa implant zone disposed in the semiconductor layer adjacent the drain region; a channel region disposed in the semiconductor layer between the source region and the first capa implant zone; a second capa implant zone disposed in the first capa implant zone adjacent the drain region; wherein a dopant concentration level of the second capa implant zone is greater than a dopant concentration level of the first capa implant zone; a floating gate electrode; and a gate oxide region including a first portion having a first thickness and a second portion having a second thickness, the second thickness being less than the first thickness; wherein the first portion insulates the floating gate electrode from the channel region; and wherein the second portion insulates the floating gate electrode from the second capa implant zone.

In an embodiment, a method comprises: implanting a first capa implant zone in a semiconductor layer; forming a first oxide layer having a first thickness on an upper surface of the semiconductor layer and extending over the first capa implant zone; providing a mask with a mask opening over a portion of the first capa implant zone; implanting a second capa implant zone in the first capa implant zone through said mask opening; using the mask opening to etch through the first oxide layer to expose an upper surface of the second capa implant zone; and through said mask opening, forming a second oxide layer having a second thickness less than the first thickness on the upper surface of the second capa implant zone.

BRIEF DESCRIPTION OF THE DRAWINGS

For a better understanding of the embodiments, reference will now be made by way of example only to the accompanying figures in which.

DETAILED DESCRIPTION

Figure 3:
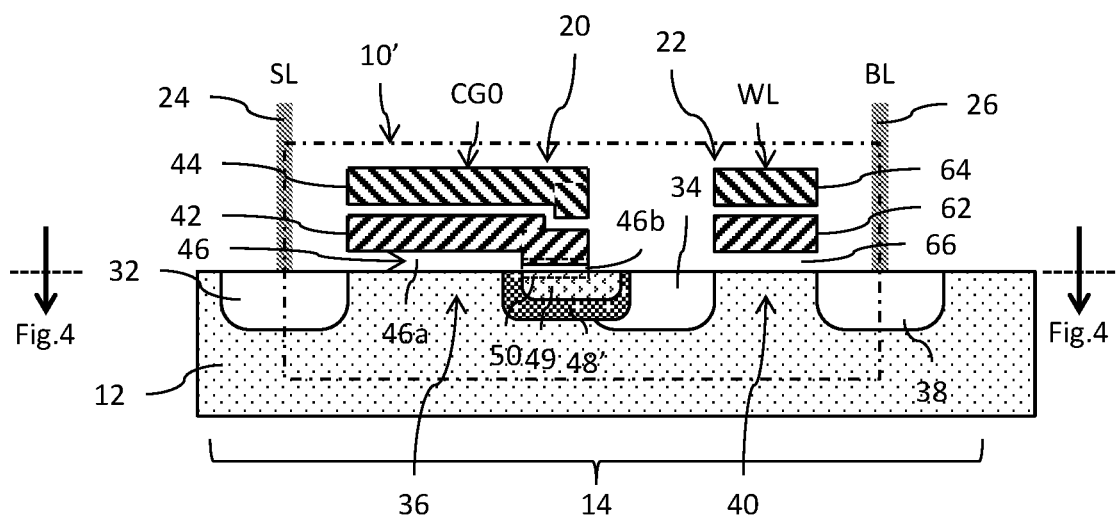
FIG. 3 is a cross-section of an EEPROM memory cell with a double capa implant.

Reference is now made to FIG. 3 which shows a cross-sectional view of an EEPROM memory cell 10' implemented as an integrated circuit. The EEPROM memory cell 10' of FIG. 3 is similar to the EEPROM memory cell 10 of FIG. 1. Like reference numbers refer to like or similar components. The EEPROM memory cell 10' of FIG. 3 differs from the EEPROM memory cell 10 of FIG. 1 in the configuration of the capa implant. The capa implant for the EEPROM memory cell 10' of FIG. 3 is a double implant comprising a first implant zone 48' in the active area 14 of the semiconductor substrate layer 12 and a second implant zone 49 in the first implant zone 48'. The first implant zone 48' is heavily doped with the second conductivity type dopant and has a first dopant concentration level. The first implant zone 48' is positioned in contact with, and functions as an extension of, the drain region 34 and is laterally dimensioned to distance the tunnel injection zone 50 from the drain-channel junction of the floating gate transistor 20. Relatively speaking, the dopant concentration level in the first implant zone 48' may be greater than or less than the dopant concentration level in the drain region 34, and the implant zone 48' may have a depth which is either shallower than (as shown) or deeper than the drain region 34. The second implant zone 49 is also heavily doped with the second conductivity type dopant and has a second dopant concentration level which is higher than the first dopant concentration level. The dopant concentration levels of the first and second capa implant zones 48' and 49 may, for example, be in the range of $1\times10^{17}$ to $1\times10^{19}$ at/cm$^3$. Relatively speaking, the dopant concentration level in the second implant zone 49 may be greater than or less than the dopant concentration level in the drain region 34. The second implant zone 49 has a depth which is shallower than the first implant zone 48', but may, dependent on implementation, have a depth which is deeper than the drain region 34.

Figure 4:
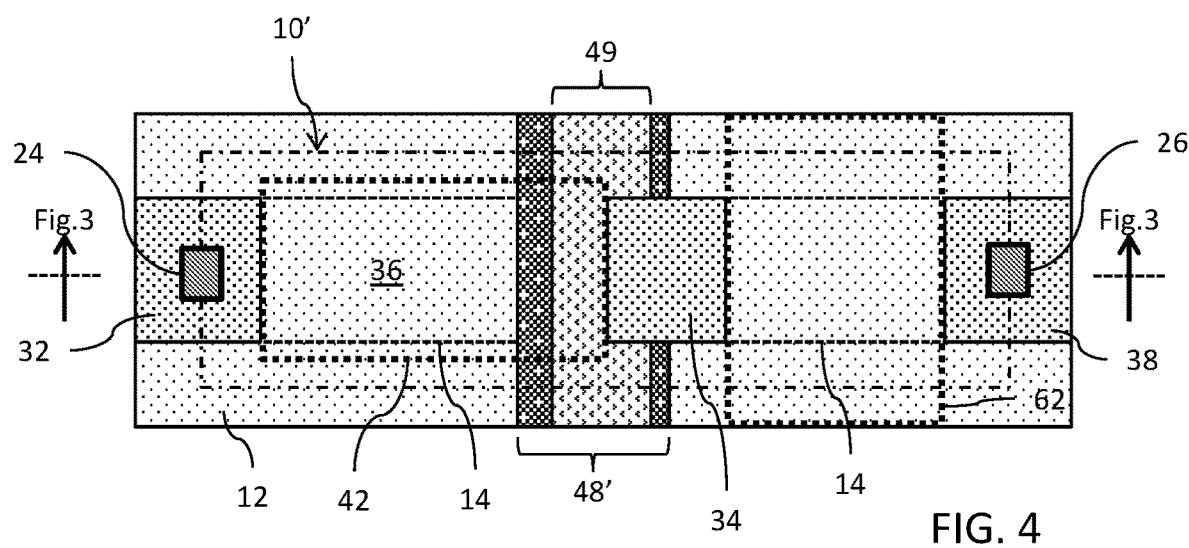
FIG. 4 is a plan view of the layout of the doped regions in the substrate for the EEPROM memory cell of FIG. 3.

FIG. 4 shows a plan view of the layout of the doped regions in the substrate layer 12 for the EEPROM memory cell 10'. The layout of FIG. 4 further shows the relative location of the active area 14, contacts for the source line 24 and bit line 26, and the placement of the gate electrode 42 and gate electrode 62. It will be noted that the gate electrode 62 and word line 64, as well as the first and second implant zones 48' and 49, extend perpendicular to the length of active area 14 (and the lengths of the transistors 20 and 22). The width of the floating gate electrode 42 extends beyond the width of the active area 14. The control gate 44 is not shown in FIG. 4, but it will be understood that it extends over multiple memory cells.

Figure 1:
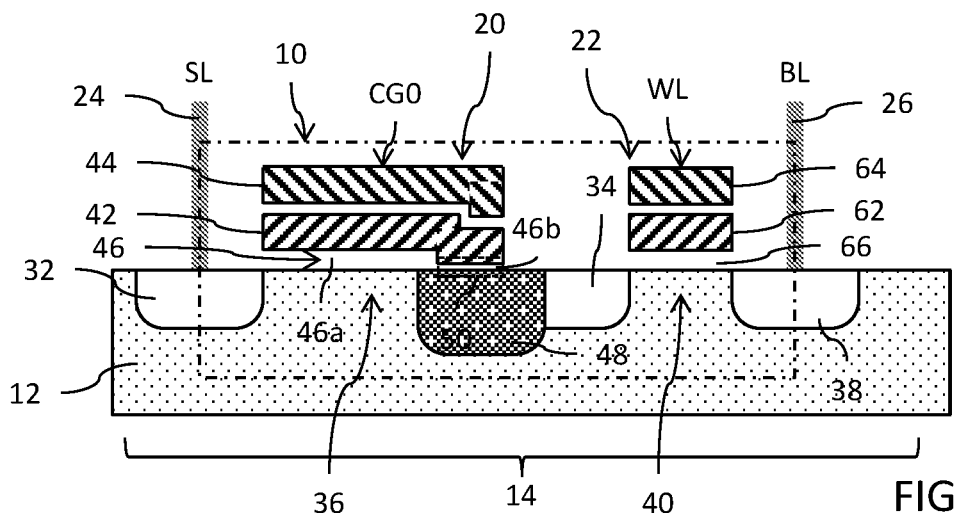
FIG. 1 is a cross-section of a conventional EEPROM memory cell.
Figure 2:
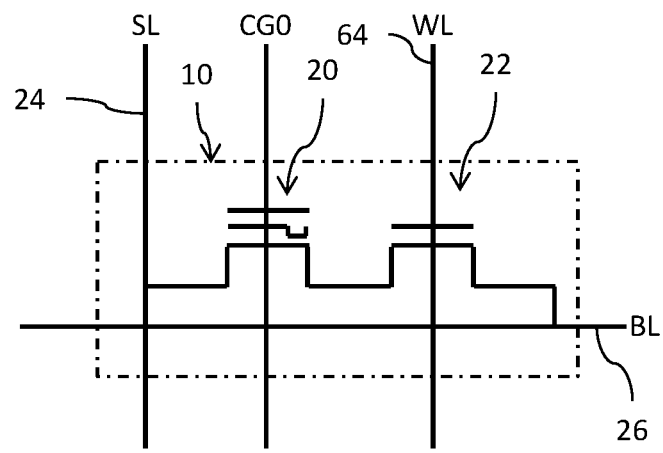
FIG. 2 shows a schematic circuit diagram of the conventional EEPROM memory cell.
Figure 5:
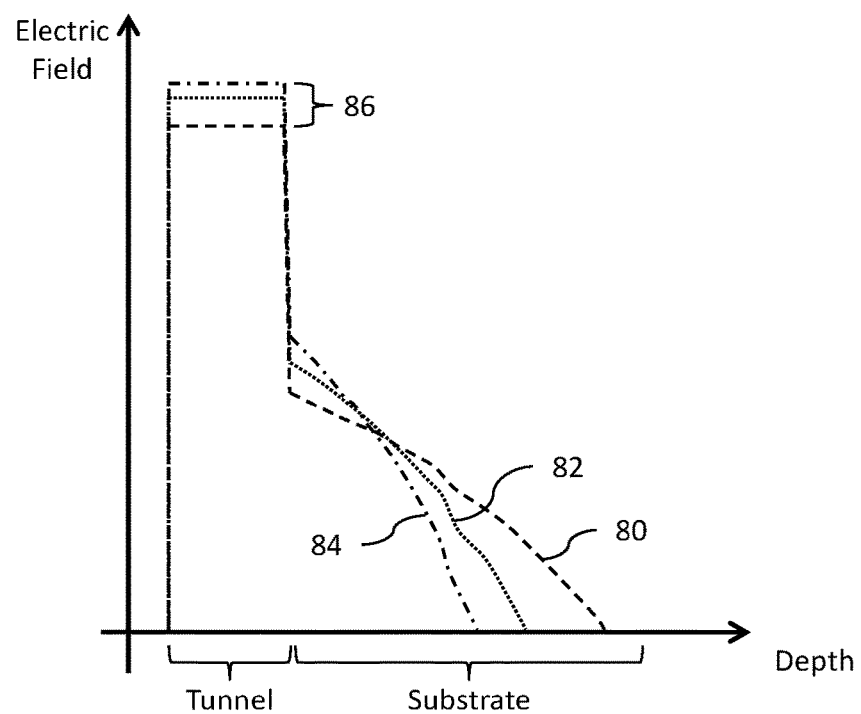
FIG. 5 is a plot of the electric field as a function of depth and compares the performance of the EEPROM memory cell of FIG. 3 to the conventional EEPROM memory cell of FIG. 1.

Reference is now made to FIG. 5 which shows a plot of the electric field as a function of depth and compares the performance of the EEPROM memory cell 10' of FIG. 3 to the conventional EEPROM memory cell 10 of FIG. 1. The plots in FIG. 5 are all relative to a same applied voltage level. Reference 80 illustrates the electric field for the conventional EEPROM memory cell 10 of FIG. 1. References 82 and 84 illustrate the electric fields for two different implementations of the EEPROM memory cell 10' of FIG. 3. For reference 82, the first implant zone 48' is identical to the implant zone 48 and the second implant zone 49 is formed by a dopant implantation at a first implantation dose (for example, $5\times10^{13}$ at/cm$^2$). For reference 84, the first implant zone 48' is identical to the implant zone 48 and the second implant zone 49 is formed by a dopant implantation at a second (higher) implantation dose (for example, $1\times10^{14}$ at/cm$^2$). Thus, for a same applied voltage, the presence of the second implant zone 49 advantageously produces a gain 86 in tunnel oxide field strength for the EEPROM memory cell 10' of FIG. 3 over the conventional EEPROM memory cell 10 of FIG. 1.

Reference is now made to FIGS. 6A-6K which illustrated process steps for fabricating the floating gate transistor 22 of the EEPROM memory cell 10' of FIG. 3. The substrate layer 12 in FIG. 6A has previously been treated with a p-type dopant implant that is specific for optimization of the memory cell. A resist layer is formed on top of the substrate layer 12 and patterned to provide a mask 100 with an opening 102 located at the position where the first implant zone 48' of the capa implant is to be provided.

Figure 6A:
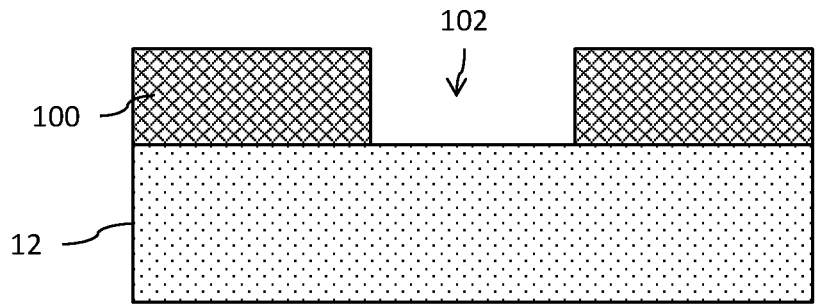
FIGS. 6A-6K show steps in a method for manufacturing the floating gate transistor of the EEPROM memory cell of FIG. 3.
Figure 6B:
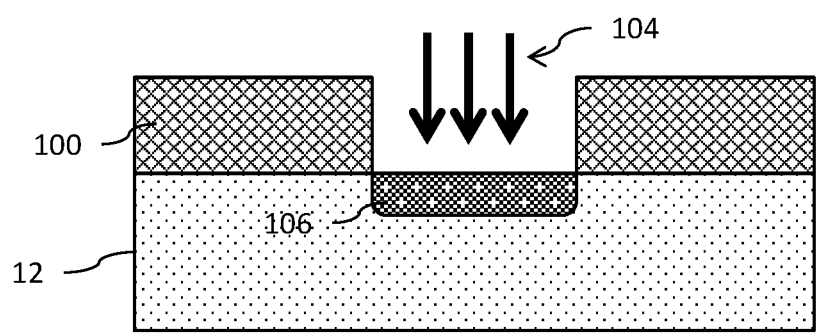

FIG. 6B shows the performance of an implantation 104 through the opening 102 to provide a first capa implant 106.

Figure 6C:
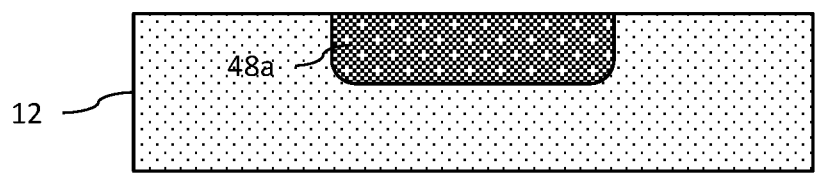

The mask 100 is then removed and a thermal anneal is performed to activate the dopants of the first capa implant 106 and form the first implant zone 48'. The result is shown in FIG. 6C.

Figure 6D:
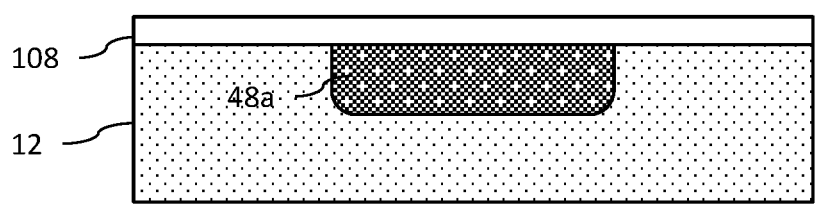

An oxidation of the upper surface of the substrate layer 12 is then performed to produce an oxide layer 108. The result is shown in FIG. 6D. This oxide layer 108 will eventually form the relatively thicker layer portion 46a of the gate oxide layer 46.

Figure 6E:
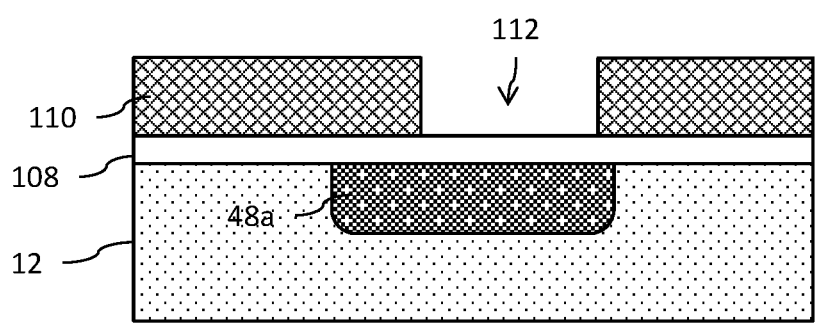

A resist layer is formed on top of the oxide layer 108 and patterned to provide a mask 110 with an opening 112 located at the position where the second implant zone 49 of the capa implant is to be provided. The result is shown in FIG. 6E.

Figure 6F:
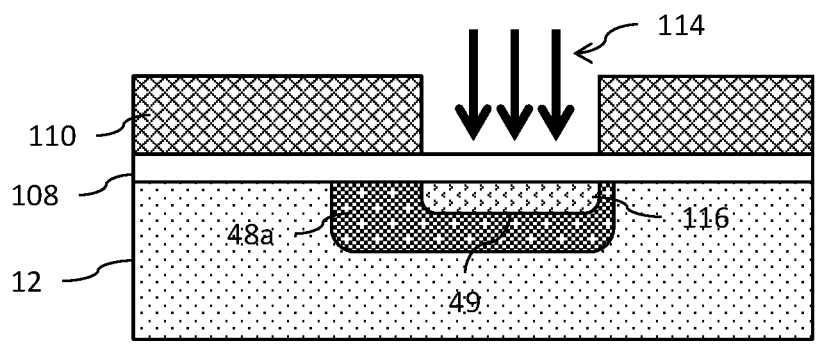

FIG. 6F shows the performance of an implantation 114 through the opening 112 to provide a second capa implant 116. This implant forms the second implant zone 49 of the capa implant (and may be activated by an appropriate anneal).

Figure 6G:
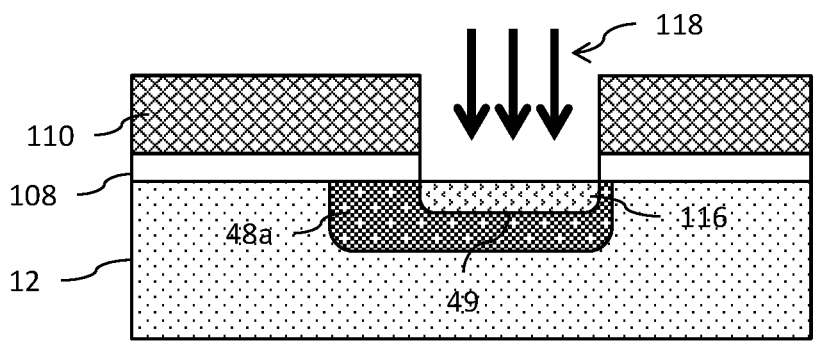

An etch 118 is then performed through the opening 112 to remove a portion of the oxide layer 108 and expose the upper surface of the substrate layer 12 at the second capa implant 116. The result is shown in FIG. 6G. The portions of the oxide layer 108 which remain contribute to the relatively thicker layer portion 46a of the gate oxide layer 46.

Figure 6H:
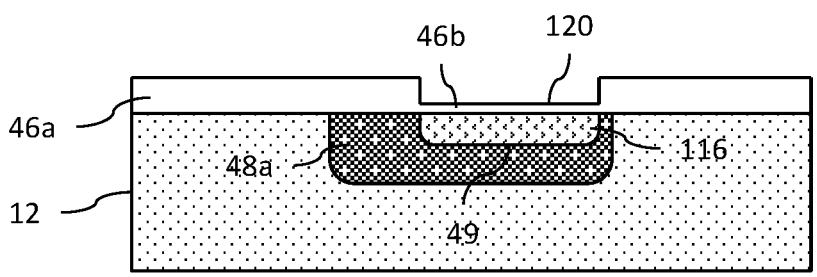

The mask 110 is then removed and an oxidation of the upper surface of the substrate layer 12 at the second capa implant 116 is then performed to produce an oxide layer 120. The result is shown in FIG. 6H. The oxidation performed here will further thicken the oxide layer 108 to reach the final desired thickness for the relatively thicker layer portion 46a of the gate oxide layer 46. This oxide layer 120 forms the relatively thinner layer portion 46b of the gate oxide layer 46. Although this implementation teaches formation of the relatively thinner layer portion 46b after implantation of the second capa implant 116, it will be understood that it is possible to alternatively form the relatively thinner layer portion 46b first. It is preferred, however, to implant first as the implantation could degrade the quality of a previously formed thin oxide layer.

Advantageously, the window provided by the opening 112 is used to define the second capa implant 116 and the oxide layer 120 which forms the relatively thinner layer portion 46b is automatically aligned with the second capa implant 116. So, a lateral edge of the second capa implant 116 will be aligned (in a vertical direction perpendicular to the upper surface of the substrate layer 12) with the location where the gate oxide changes thickness.

Conformal deposition processes are then used to sequentially deposit: a) a first polysilicon layer 124; b) an ONO tri-layer 126 and c) a second polysilicon layer 128. Conventional lithographic processing techniques (for example, a mask and etch) are then used to pattern the stack formed by the first polysilicon layer 124, ONO tri-layer 126 and second polysilicon layer 128 to define the gate structure 130 for the floating gate transistor 20 and the gate structure 132 for the access transistor 22. The result is shown in FIG. 6I.

Through an opening 134 between the gate structures 130 and 132, an implantation 136 is performed. An anneal then activates the implanted dopants to form the source/drain region 34. The result is shown in FIG. 6J.

Figure 6I:
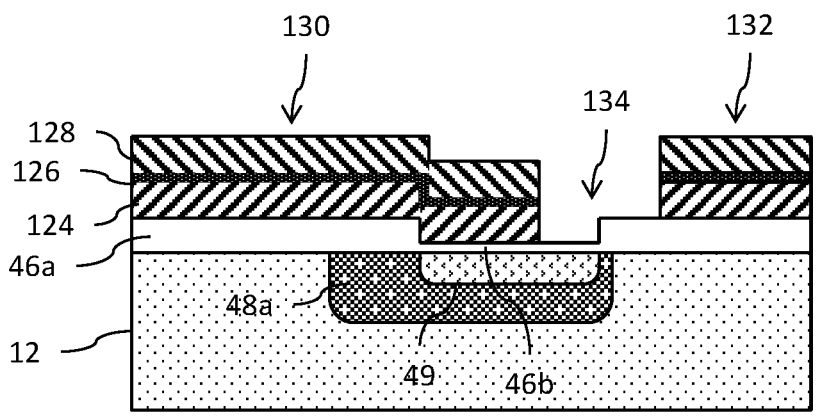
Figure 6J:
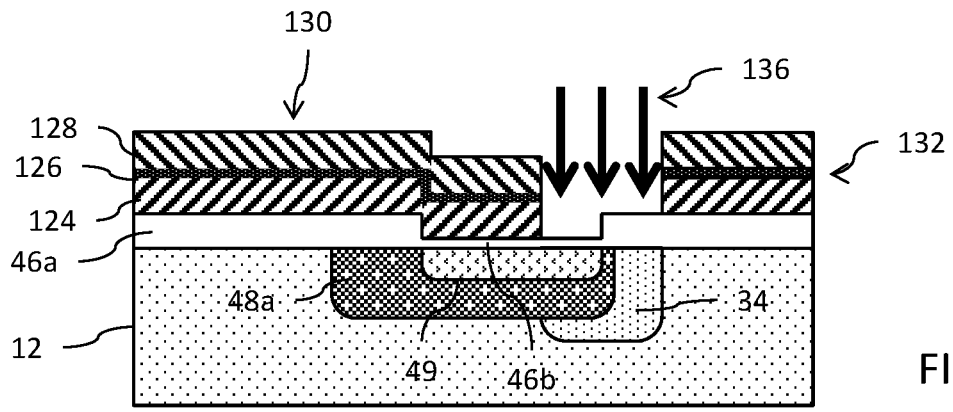

It will be noted, even though not explicitly illustrated by FIG. 6I, that the lithographic processing techniques also form openings on the opposite sides of the gate structures 130 and 132, and the implantation 136 also occurs through those openings for the purpose of forming the source/drain regions 32 and 38.

Figure 6K:
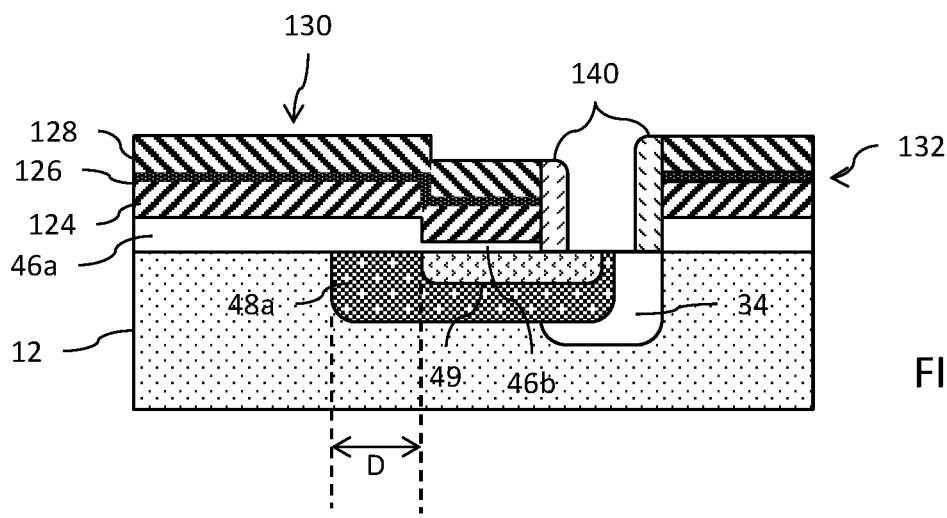

Portions of the oxide layers 106 and 120 present in the opening 134 are removed by etching. Sidewall spacers 140 are then formed on the side walls of the gate structures 130 and 132 in the opening 134. The result is shown in FIG. 6K.

The process for fabrication then proceeds in accordance with well-known steps for forming silicides, dielectric layers and electrical contacts.

The provision of the relatively more highly doped second implant zone 49 (from the second capa implant 116) within the first implant zone 48' at the tunnel injection zone 50 serves to reduce depletion of the capa implant region during programming operations. Because the second implant zone 49 is auto-aligned with the tunnel area and is offset by a distance "D" (see, FIG. 6K) from the edge of the first implant zone 48', there is no concern with a decrease in the breakdown voltage of the existing drain/channel junction of the floating gate transistor 20. The distance "D" extends parallel to the upper surface of the substrate layer 12 in a direction of the length of the floating gate transistor 22 (i.e., in the direction extending from the source region 32 to the drain region 34).

The EEPROM memory cell 10' of FIG. 3 presents a substantial improvement over the EEPROM memory cell 10 of FIG. 1. With the use of the capa implant including both the first implant zone 48' and the second implant zone 49, a given program $\Delta Vt$ voltage can be obtained at a lower program activation voltage level; and for an increase in program activation voltage level there is a corresponding improvement in the program $\Delta Vt$ voltage. The use of the second implant zone 49 further permits the memory cell designer to have more freedom in technical tradeoff among and between: tunnel oxide thickness, maximum applied voltage level, programming time, and program $\Delta Vt$ voltage. The second implant zone 49 also supports a global gain in reliability of the EEPROM memory cell 10' because: lower voltages or a thicker tunnel oxide layer can be used in achieving a desired program window; and there is an improvement in data retention with a reduction in MOS breakdown failure rate.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. An electrically erasable and programmable nonvolatile memory including a memory cell, wherein the memory cell comprises a floating gate transistor comprising:
   a source region disposed in a semiconductor layer;
   a drain region disposed in the semiconductor layer;
   a first capa implant zone disposed in the semiconductor layer adjacent the drain region;
   a channel region disposed in the semiconductor layer between the source region and the first capa implant zone;
   a second capa implant zone disposed in the first capa implant zone adjacent the drain region;
   wherein a dopant concentration level of the second capa implant zone is greater than a dopant concentration level of the first capa implant zone;
   a control gate electrode;
   a floating gate electrode, wherein the floating gate electrode is insulated from the control gate electrode; and
   a gate oxide region insulating the floating gate electrode from the channel region, the first capa implant zone and the second capa implant zone, wherein the gate oxide region has a first thickness over the channel region and a second thickness, less than the first thickness, over the second capa implant zone.

2. The electrically erasable and programmable nonvolatile memory of claim 1, wherein an edge of the first capa implant zone is laterally offset, in a direction parallel to an upper surface of the semiconductor layer, from an edge of the second capa implant zone.

3. The electrically erasable and programmable nonvolatile memory of claim 1, wherein a portion of the first capa implant zone is present at an upper surface of the semiconductor layer between the channel region and the second capa implant zone.

4. The electrically erasable and programmable nonvolatile memory of claim 3, wherein the gate oxide region has the first thickness over said portion.

5. The electrically erasable and programmable nonvolatile memory of claim 1, wherein a change in thickness of the gate oxide region from the first thickness to the second thickness is aligned with a lateral edge of the second capa implant zone.

6. The electrically erasable and programmable nonvolatile memory of claim 1, wherein the memory cell further comprises a selection transistor electrically connected in series with the floating gate transistor.

7. The electrically erasable and programmable nonvolatile memory of claim 6, wherein the drain region further provides a source region of the selection transistor.

8. The electrically erasable and programmable nonvolatile memory of claim 1, wherein a dopant concentration level of the drain region is greater than the dopant concentration level of the second capa implant zone.

9. The electrically erasable and programmable nonvolatile memory of claim 1, wherein a dopant concentration level of the drain region is greater than the dopant concentration level of the first capa implant zone.

10. The electrically erasable and programmable nonvolatile memory of claim 1, wherein a dopant concentration level of the drain region is less than the dopant concentration level of the second capa implant zone.

11. The electrically erasable and programmable nonvolatile memory of claim 1, wherein a dopant concentration level of the drain region is less than the dopant concentration level of the first capa implant zone.

12. A floating gate transistor, comprising:
a source region disposed in a semiconductor layer;
a drain region disposed in the semiconductor layer;
a first capa implant zone disposed in the semiconductor layer adjacent the drain region;
a channel region disposed in the semiconductor layer between the source region and the first capa implant zone;
a second capa implant zone disposed in the first capa implant zone adjacent the drain region;
wherein a dopant concentration level of the second capa implant zone is greater than a dopant concentration level of the first capa implant zone;
a control gate electrode;
a floating gate electrode, wherein the floating gate electrode is insulated from the control gate electrode; and
a gate oxide region including a first portion having a first thickness and a second portion having a second thickness, the second thickness being less than the first thickness;
wherein the first portion insulates the floating gate electrode from the channel region; and
wherein the second portion insulates the floating gate electrode from the second capa implant zone.

13. The floating gate transistor of claim 12, wherein an edge of the first capa implant zone is laterally offset, in a direction parallel to an upper surface of the semiconductor layer, from an edge of the second capa implant zone.

14. The floating gate transistor of claim 12, wherein the first portion further insulates the floating gate electrode from the first capa implant zone.

15. The floating gate transistor of claim 12, wherein a change in thickness of the gate oxide region from the first thickness to the second thickness is aligned with a lateral edge of the second capa implant zone.

16. The floating gate transistor of claim 12, wherein a dopant concentration level of the drain region is greater than the dopant concentration level of the second capa implant zone.

17. The floating gate transistor of claim 12, wherein a dopant concentration level of the drain region is greater than the dopant concentration level of the first capa implant zone.

18. The floating gate transistor of claim 12, wherein a dopant concentration level of the drain region is less than the dopant concentration level of the second capa implant zone.

19. The floating gate transistor of claim 12, wherein a dopant concentration level of the drain region is less than the dopant concentration level of the first capa implant zone.

20. A floating gate transistor, comprising:
a source region disposed in a semiconductor layer;
a drain region disposed in the semiconductor layer;
a channel region disposed in the semiconductor layer;
a first capa implant zone disposed in the semiconductor layer between the channel region and the drain region;
a second capa implant zone that is disposed in and surrounded by the first capa implant zone;
wherein a dopant concentration level of the second capa implant zone is greater than a dopant concentration level of the first capa implant zone;
a control gate electrode;
a floating gate electrode, wherein the floating gate electrode is insulated from the control gate electrode; and
a gate oxide region including a first portion having a first thickness and a second portion having a second thickness, the second thickness being less than the first thickness;
wherein the first portion insulates the floating gate electrode from the channel region and the first capa implant zone; and
wherein the second portion insulates the floating gate electrode from the second capa implant zone.

21. The floating gate transistor of claim 20, wherein a change in thickness of the gate oxide region from the first thickness to the second thickness is aligned with a lateral edge of the second capa implant zone.

22. The floating gate transistor of claim 20, wherein a dopant concentration level of the drain region is greater than the dopant concentration level of the first capa implant zone and greater than the dopant concentration level of the second capa implant zone.

23. The floating gate transistor of claim 20, wherein a dopant concentration level of the drain region is less than the dopant concentration level of the first capa implant zone and less than the dopant concentration level of the second capa implant zone.

* * * * *